United States Patent
Ramakrishnan et al.

(10) Patent No.: US 8,434,038 B2
(45) Date of Patent: Apr. 30, 2013

(54) CONSISTENCY CHECK IN DEVICE DESIGN AND MANUFACTURING

(75) Inventors: Raghunathann Ramakrishnan, Singapore (SG); Zia Ahmed, Singapore (SG); Raymond Filippi, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 112 days.

(21) Appl. No.: 12/829,408

(22) Filed: Jul. 2, 2010

(65) Prior Publication Data
US 2012/0005633 A1 Jan. 5, 2012

(51) Int. Cl.
*G06F 9/455* (2006.01)

(52) U.S. Cl.
USPC .......... 716/107; 716/50; 716/52; 716/136

(58) Field of Classification Search .......... 716/50, 716/52, 119, 136, 107
See application file for complete search history.

(56) References Cited

U.S. PATENT DOCUMENTS

| | | | |
|---|---|---|---|
| 7,284,214 B2 | 10/2007 | LeBritton et al. | |
| 8,001,516 B2 * | 8/2011 | Smith et al. | 716/136 |
| 2003/0229881 A1 * | 12/2003 | White et al. | 716/19 |
| 2008/0022254 A1 * | 1/2008 | Luo et al. | 716/19 |
| 2009/0031261 A1 * | 1/2009 | Smith et al. | 716/2 |
| 2011/0161907 A1 * | 6/2011 | Cheng et al. | 716/119 |

* cited by examiner

*Primary Examiner* — Vuthe Siek
*Assistant Examiner* — Mohammed Alam
(74) *Attorney, Agent, or Firm* — Horizon IP Pte. Ltd.

(57) ABSTRACT

A method of forming a device is disclosed. The method includes providing at least one original artwork file having front end and back end information. The original artwork file includes an original artwork file format. A modified artwork file corresponding to the original artwork file is provided in a first modified artwork file format. The modified artwork file contains back end information. The method also includes checking to ensure that the original and modified artwork files are consistent.

20 Claims, 5 Drawing Sheets

CONSISTENCY CHECK IN DEVICE DESIGN AND MANUFACTURING

BACKGROUND

Intellectual property (IP) modules are often used by an IP provider, such as a foundry. The IP modules are provided as a library kit to be used by end users or customers to design a full chip. The IP modules provided in the library kit are modified IP modules from original IP modules to protect disclosure of sensitive IP information to the end user.

However, there may be inconsistencies in the modified IP modules and original IP modules. The inconsistencies may be incomplete information or reversal of information in the modified IP files. These inconsistencies may create fatal failures in the final manufactured device. Therefore, there is a desire to provide modified IP modules which are consistent with original IP modules.

SUMMARY OF THE INVENTION

A method of forming a device is disclosed. The method includes providing at least one original artwork file having front end and back end information. The original artwork file includes an original artwork file format. A modified artwork file corresponding to the original artwork file is provided in a first modified artwork file format. The modified artwork file contains back end information. The method also includes checking to ensure that the original and modified artwork files are consistent.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, for example, semiconductor devices or integrated circuits. The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

Figure 1:
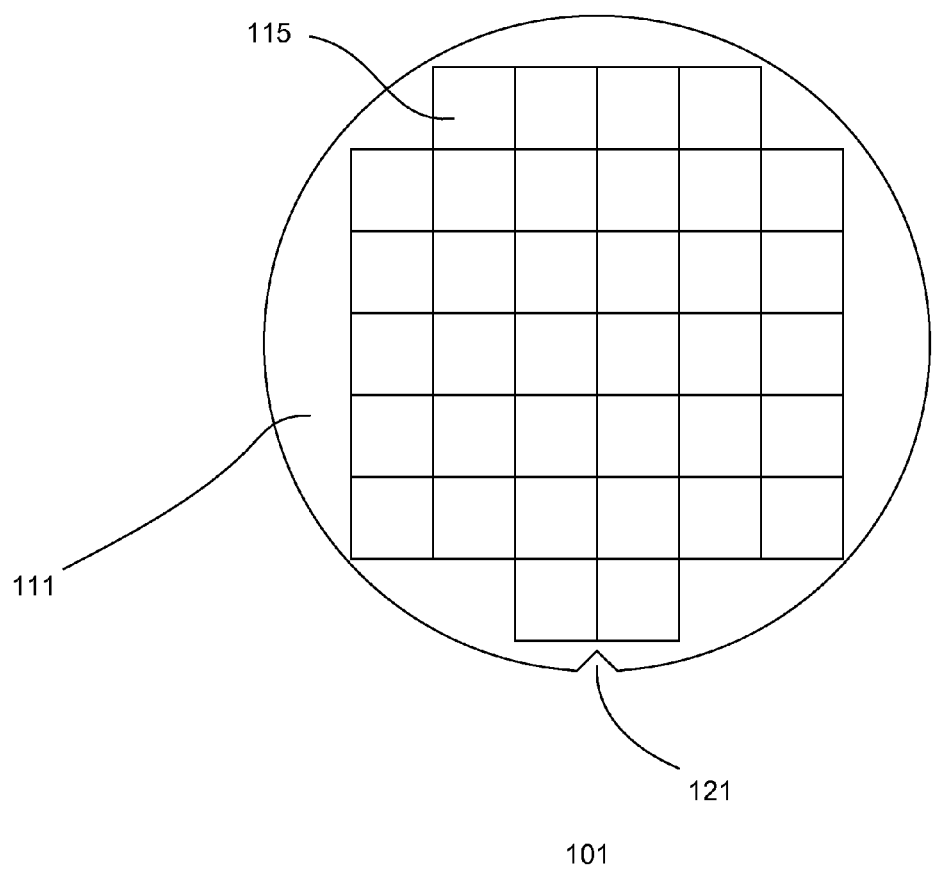
FIG. 1 shows a semiconductor wafer.

FIG. 1 shows a semiconductor wafer 101. The semiconductor wafer, for example, comprises a silicon wafer. Other types of wafers are also useful. For example, the wafer may be a p-type, n-type, silicon-on-insulator or silicon germanium wafer. Depending on the type of device, the wafer may comprise a non-semiconductor material. The wafer may include a notch 121 to indicate the crystal orientation of the wafer. Other techniques for indicating the crystal orientation may also be useful. Additional indicators may also be included to indicate the dopant type of the wafer.

The wafer includes an active surface 111 on which devices 115 are formed. A plurality of devices may be formed on the wafer in parallel. The devices, for example, are arranged in rows along a first (x) direction and columns along a second (y) direction. The devices are subsequently singulated into individual dies, assembled and tested. In other embodiments, the wafer may include a single device.

The fabrication of devices, such as integrated circuits (ICs), involves the formation of features on a substrate that make up circuit components, such as transistors, resistors and capacitors. The devices are interconnected, enabling the device to perform the desired functions. Interconnections are formed by forming contacts and conductive lines in a dielectric layer using, for example, damascene techniques. The features and interconnections are formed by repeatedly depositing and patterning layers on the wafer. The devices may have multiple interconnection layers. The structures of the different layers of the device are created or patterned using respective mask and etch techniques.

The various features and interconnections are strategically placed on the device to minimize the use of space and/or optimize performance. The placement of various features and interconnections is referred to as a product or device layout. The layers which form the components are in the lower levels while the interconnections are in the upper levels of the device layout. The interconnections may be provided in a plurality of interconnect levels.

The final product layout is contained in a final artwork file. The final artwork file contains complete information of the final product layout, including feature placements, interconnect routings, pin placements and pin definitions. For example, the various layers of the product are contained in the final artwork file. The final artwork file, for example, can be a GSDII format file. Providing final artwork files in other formats may also be useful. For example, the final artwork file may be in a OASIS format.

Figure 2:
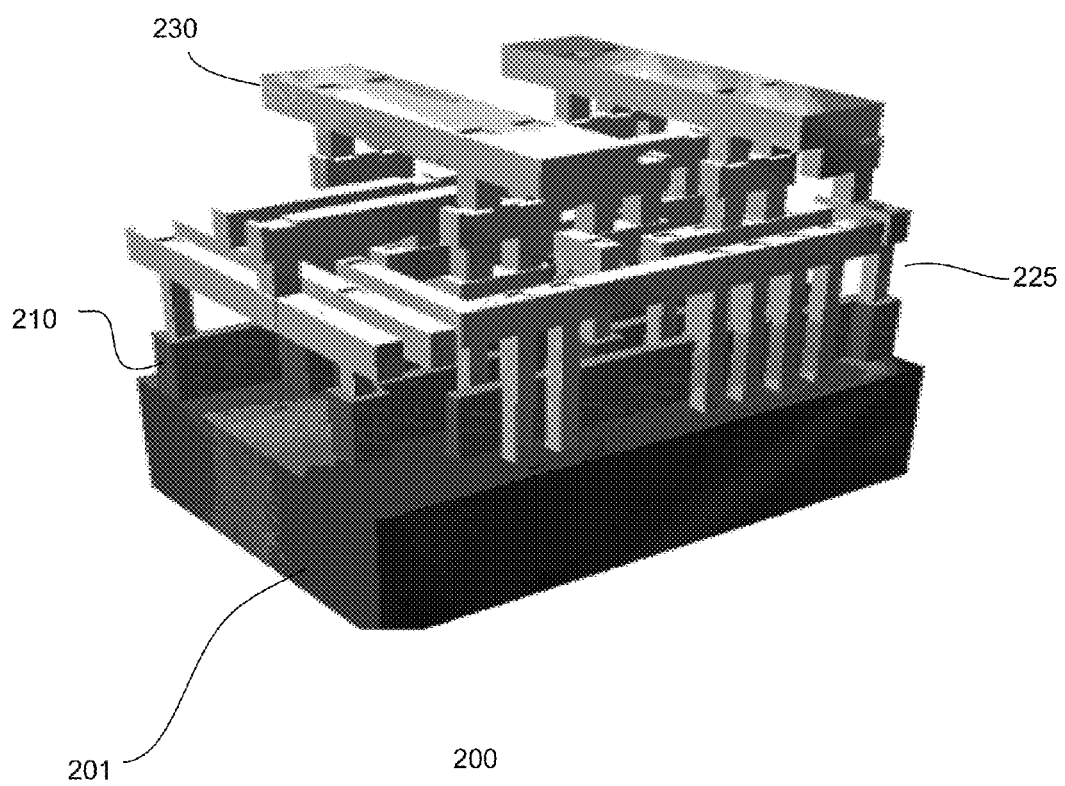
FIG. 2 shows a 3-dimensional rendering of a cell.

FIG. 2 illustrates a 3-dimensional view of an example of a portion of a device 200 in GDSII format. The portion, for example, may be a cell of a device. The view (e.g., GDSII view) shows a substrate 201 with a patterned polysilicon layer 210 which forms polysilicon lines. The polysilicon lines, for example, represent gate electrodes of transistors. Three metal layers 230 are provided in the cell. The metal layers are coupled to the substrate and gates by contacts represented by posts 225.

Figure 3:
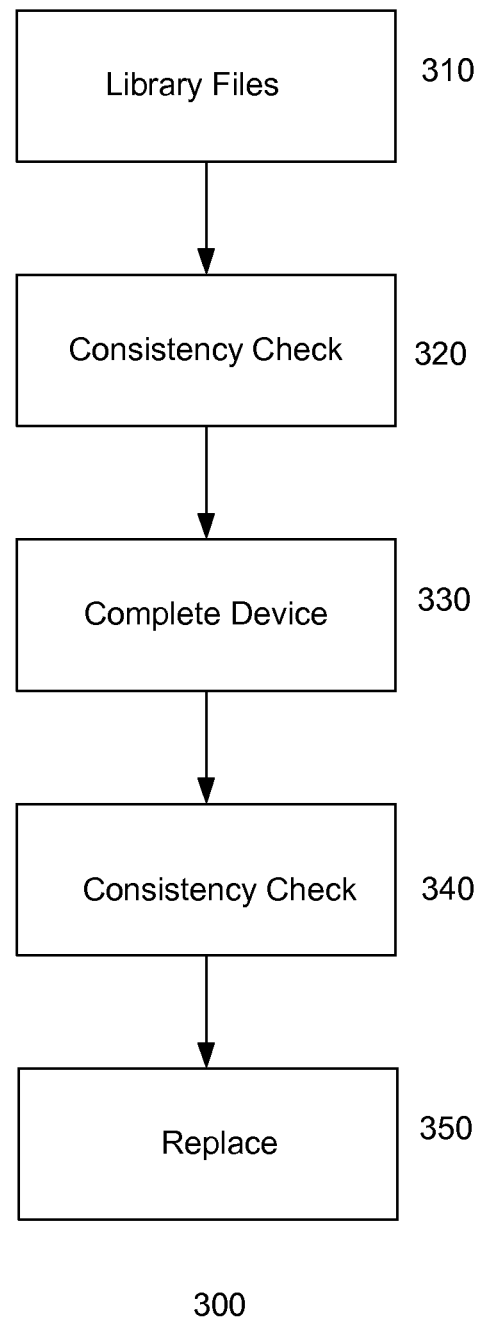
FIG. 3 shows an embodiment of a process for developing a device.

In the design process, multiple parties, groups or entities may be involved in the development to complete the full device. FIG. 3 shows an embodiment of a process 300 for developing a full device. In one embodiment, at step 310, a first group may develop a plurality of modules. The first group may, for example, be an IP provider. For example, the IP provider may be a foundry. Other types of IP or service providers may also be useful. A module, for example, contains circuitry for performing a specific function. The complete layout information of a module is contained in an artwork file. For example, the artwork file contains component layout, interconnects, pin definitions and pin labels. The artwork file, for example, comprises a GDSII file. Providing artwork files in other formats may also be useful.

Different modules may be provided to perform different functions. The different modules, for example, are contained in respective artwork files. Various modules may be combined to form a complete chip with the desired functions.

A design rule check (DRC) is performed on the artwork files to ensure compliance with design rules. Additionally, a layout versus schematic (LVS) check is performed to ensure that the artwork files are based on the schematics. Performing other types of checks may also be useful.

In one embodiment, modules are intended to be provided to a second group for use in designing a full device or chip. The second group, for example, is an end user or customer which designs the full chip according to the available modules. In other embodiments, a full chip may be provided in a single artwork file. For example, the full chip may have options for which the second group may select to perform the desired functions.

Prior to providing the artwork files of the modules or the chip to the second group, they are modified. In one embodiment, the artwork files are modified prior to providing them to the second group. The modified artwork files contain less information than the original versions of the artwork files in, for example, GDSII format. The modified artwork files contain information sufficient for the second group to complete the design of the full device, while maintaining other portions of the device secret. In one embodiment, the modified artwork files contain information sufficient to enable the second group to complete design place and route of the device. Design place and route, for example, refer to the placement of selected modules and interconnecting them to form a device. Preferably, the modified artwork files contain only back end or interconnection information. This facilitates maintaining the confidentiality of the IP of the first party or IP provider. In some cases, some additional information may be provided in the modified artwork files, but not sufficient to divulge the IP of the first party.

The modified artwork file comprises a modified artwork file format. In one embodiment, the modified artwork file comprises only back end of line (BEOL) information. For example, the modified format comprises information related to the interconnect layers. No front end of line (FEOL) information is included in the modified format. In one embodiment, the modified format comprises a Phantom GDSII format. The Phantom GDSII format file is similar to an actual GDSII format file except that only interconnect or back end layers are shown. The back end layers in Phantom GDSII format are represented as BEOL polygons, for example, which correspond to interconnects or pin information of the interconnect layers.

In another embodiment, the modified artwork file format comprises a library exchange format (LEF). The LEF comprises an ASCII representation of the interconnect layers of the unmodified artwork file. The LEF is an ASCII representation, which includes metal blockage areas and pin definitions. For example, a LEF view includes interconnect layers of the module and contains information of the pins (e.g., size and location), metal blockage areas (e.g., reserved areas in the interconnect layers), via blockage areas (reserved areas in the via levels) and LEF Antenna information. The blockage areas correspond to non-manufacturable areas where interconnects are not allowed. This assists place and route tools to form interconnections.

Figure 4:
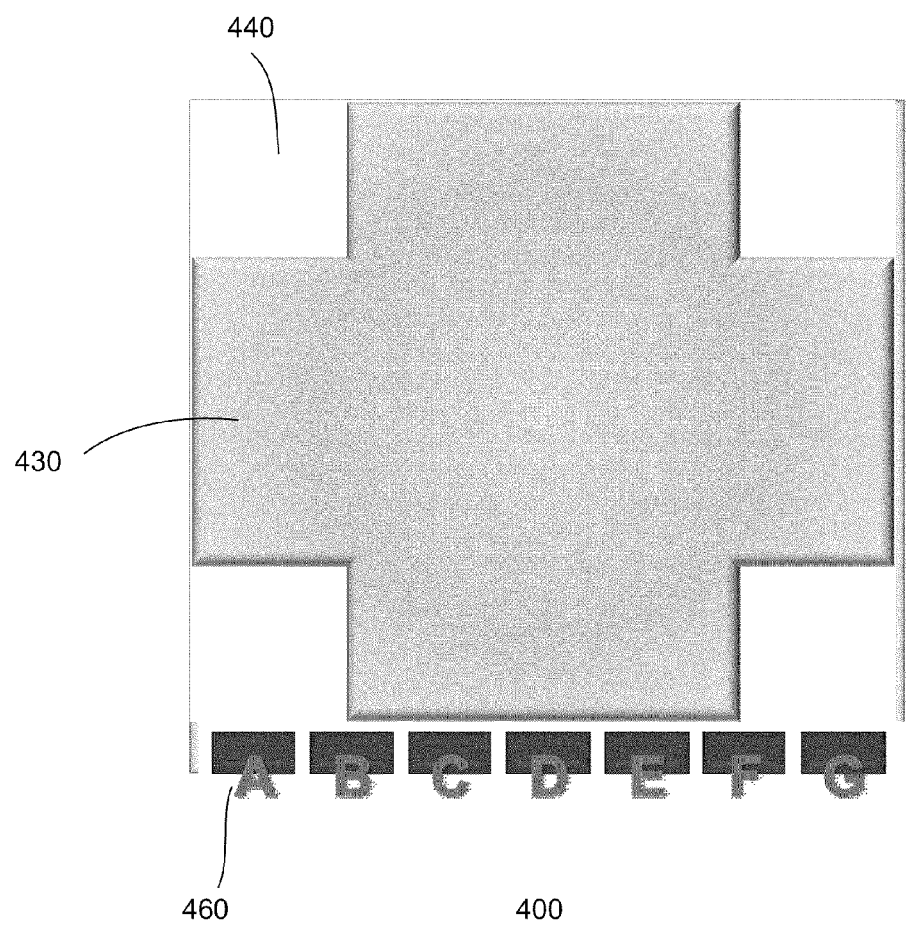
FIG. 4 shows an example of an LEF view.

FIG. 4 shows an example of pictorial representation of a LEF view 400. As shown, the interconnect layer includes metal blockage area 430 which is a reserved area. For example, the second group cannot use the reserved areas of the layer for placement or routing of interconnects. An unreserved area 440 unblocked by the metal blockage area may be used by the second group for routing of interconnects. Pins 460, along with their sizes and locations, are provided in the LEF view.

After the artwork files of the modules have been modified, they are compiled into a library which can be accessed by the second group. In one embodiment, the library may contain modified artwork files in a first modified format. For example, the modified files may be in a Phantom GDSII format. Alternatively, the modified files may be in a LEF format. Other types of modified formats may also be useful. In other embodiments, the library may contain modified files in first and second modified formats. For example, the modified artwork files may be provided in both Phantom and LEF formats. Providing modified files in multiple formats provides flexibility for the second group.

Referring back to FIG. 3, the one or more modified files which form the library may be checked for consistency at step 320. The consistency check may be performed by a consistency check tool. In one embodiment, the consistency check ensures that the modified artwork files are consistent with their respective original or unmodified artwork files. The consistency check verifies that specified features are consistent between the different views of the different files. For example, the Phantom GDSII and/or LEF files are checked to ensure consistency with their respective GDSII files.

If any of the modified module files is not consistent with the corresponding unmodified module file, consistencies are corrected in the inconsistent modified module file until it is consistent with its corresponding unmodified module file. The process continues to step 330 if all modified files which are to be in the library are consistent with their corresponding unmodified module files.

In some embodiments, the modified files may be provided to the second group without being checked for consistency. In such cases, the process continues to step 330.

At step 330, the second group may select the desired modified files from the library to design a full device. For example, based on the second group's specification or requirements, the appropriate modules are selected. The selected modules are placed in the overall device layout. Routings of the interconnects to couple the modules together as well as to the pins of the device for external access are provided to complete the layout of the device in the modified artwork file format. The complete device layout of the device in the modified artwork file format, for example, may be referred to as the modified device file.

The completed layout in the modified artwork file or modified device file is provided to a third group to process the device file in order to manufacture the device for the customer. The third group, for example, is an external vendor. The third group may be a service provider, such as a foundry. In some instances, the third group may be the same as the first group. For example, the first and third group may be a foundry. In other embodiments, the first and third groups are different.

The modified device file, in one embodiment, is checked for consistency at step 340. The modified device file is checked for consistency by, for example, the third group. The consistency check may be performed by a consistency check tool. In one embodiment, the consistency check ensures that the modified device file is consistent with an original or unmodified device file. The device file may be a combination of selected modified files of modules which have been placed and routed with interconnects to form the device. In such cases, the unmodified device file may be based on the combination of the unmodified files as the selected modified files of the modules, including placement and routing. For example, the device file in the modified format, such as Phantom GDSII and/or LEF format, is checked to ensure that it is consistent with the corresponding device file in actual or unmodified GDSII format.

If the modified device file is not consistent with the corresponding unmodified device file, consistencies are corrected in the modified device file until files are consistent. The process continues to step 350 if the modified device file is consistent with the corresponding unmodified device file.

In one embodiment, consistency check on the modified device file is performed if the modified module files in the library were not checked for consistency. In other embodiments, the modified module files in the library were not checked for consistency and the modified device file is checked for consistency with a corresponding unmodified device file. In yet other embodiments, the modified module files in the library were checked for consistency and the modified device file is checked for consistency with a corresponding unmodified device file. In the case where consistency check is not preformed on the modified device file, the process continues to step 350.

Since the modified device file does not include all information necessary to obtain a tape out used to form the photomasks in manufacturing the devices, it is processed at step 350 to obtain the additional information to perform tape out. In one embodiment, the modified device file is replaced with the unmodified device file to produce a final device file. The final device file is in the final artwork file format. For example, the final device file is in the GDSII format. The final device file is used to form MEBES files which are used to form photomasks employed in the manufacturing of the device.

Figure 5:
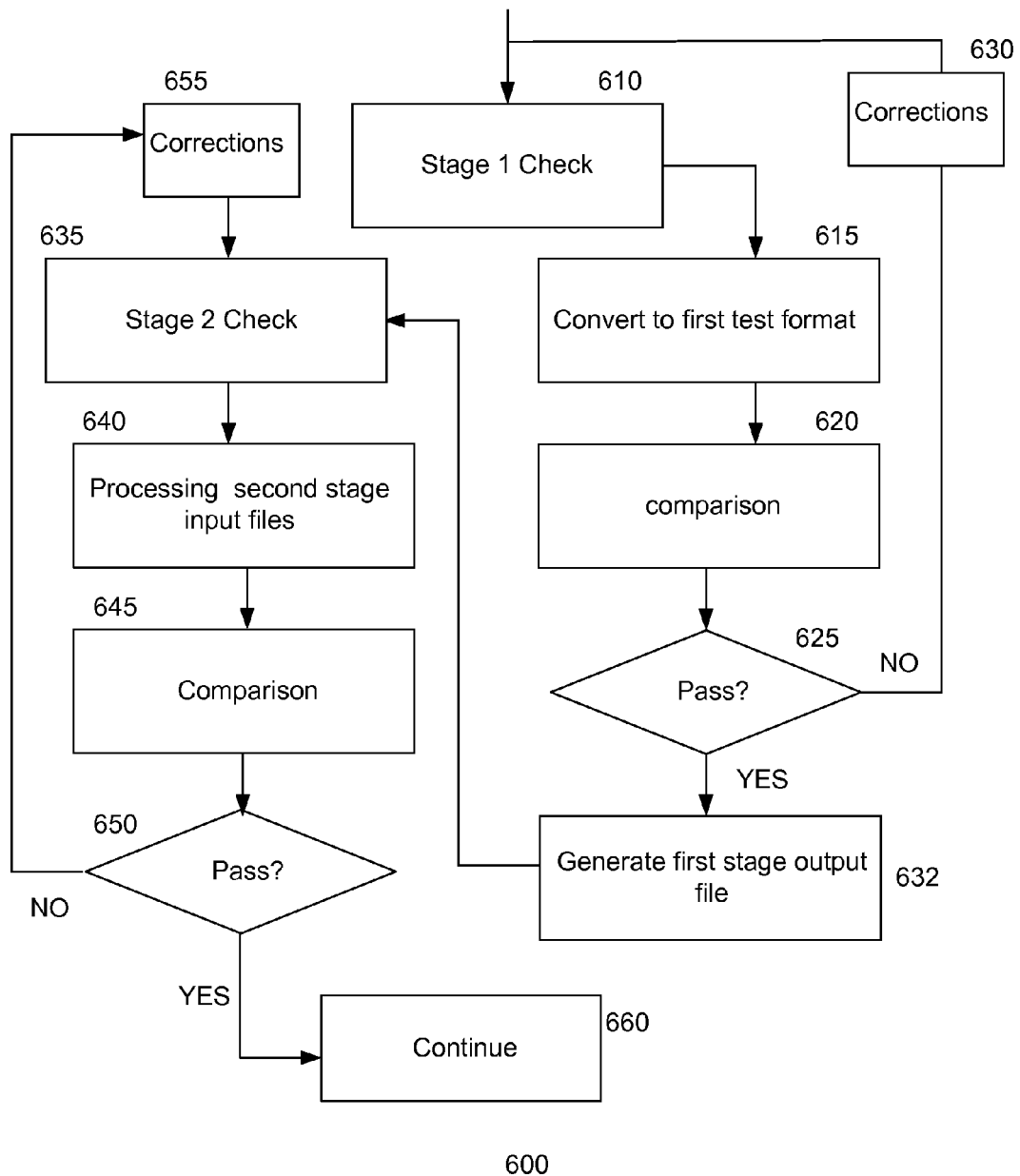
FIG. 5 shows an embodiment of a process for consistency check.

FIG. 5 shows an embodiment of a process 600 for consistency checking. In one embodiment, at step 610, a first stage check is performed. The first stage check, in one embodiment, comprises converting a modified and corresponding unmodified artwork files into a first test format at step 615. The artwork file may be a device file or a module file. The device file may be a file of a complete device while the module file is a file of a portion of a device. The first test format, for example, comprises a format different from the modified and unmodified file formats. The first test format represents the back end or interconnect layers of the device or module. In one embodiment, the first test format comprises a design exchange format (DEF). DEF is used to define back end layers of the IC design in ASCII format.

In one embodiment, a modified artwork file is provided in first and second modified formats. In one embodiment, a modified artwork file is provided in a first modified or Phantom GDSII format and a second modified or LEF format. Providing modified artwork files in other types or number of formats is also useful. In one embodiment, first and second modified artwork files in first and second modified formats are converted into first and second modified test files in the test format and the unmodified artwork file is converted into an unmodified test file in the test format. For example, the first and second modified files in Phantom GDSII and LEF formats and the unmodified file in GDSII format are converted into respective test files in DEF format.

The first stage check compares the test files for consistency with each other at step 620. In one embodiment, the first stage check compares the modified test files with the unmodified test file for consistency. For example, the first stage check compares a set of features in the modified test files for consistency with the unmodified test file. In one embodiment, the first stage check compares a set of features for consistency among the various files in the test format. For example, the first and second modified artwork files and the unmodified artwork file in the test format are compared with each other for consistency. The comparison may include, for example, the first modified artwork file in the test format with the second modified artwork in the test format, the first modified artwork file in the test format with the unmodified artwork file in the test format, and the second modified artwork file in the test format with the unmodified artwork file in the test format. Other combinations of comparisons between the files may also be useful. Although the term "set" is used, it is contemplated to encompass a single feature as well. In one embodiment, the first set of features comprises pin information. For example, the pin information may comprise pin name, pin layer, pin location, pin width, polygon alignment, and missing or extra pin or a combination thereof. Checking for other or additional features may also be useful for the first set of features.

If the consistency check on the first set of features fails, correction is made to the modified files at step 630. The process returns to step 610 and repeats until the consistency check on the first set of features is successful. If the consistency check on the first set of features is successful, a first stage output file is provided at step 632. In one embodiment, the first stage output file is derived from one of the modified artwork files in the modified format which passed the first stage consistency check. In one embodiment, the first stage output file is derived from the modified artwork file in LEF format file which passed the first stage consistency check. The modified artwork file in LEF format is converted to the artwork file format. In one embodiment, the modified artwork file in LEF format is converted to the GDSII format. Providing the first stage output file in other formats or deriving it from other types of modified artwork files may also be useful.

The process continues to step 635 for a second stage check. In one embodiment, the second stage check comprises processing second stage input files. The second stage input files are in a second test format. In one embodiment, the second test format comprises GDSII or format compatible with GDSII, such as OASIS format. Other second test formats may also be useful. The second stage input files, in one embodiment, comprise the modified artwork file, the unmodified artwork file and the first stage output file. For example, the modified artwork file is in Phantom GDSII format, the unmodified artwork file is in GDSII format and the first stage output file is in GDSII format. The modified artwork file, for example, is different from the one which the first stage output file is derived.

In one embodiment, processing the second stage input files comprises merging the unmodified artwork file with the first stage output file to form a merged second stage artwork file and merging the modified artwork file with the first stage output file to form a merged second stage modified artwork file. Merging the file may be achieved using, for example, a standard EDA layout editing tool. Other types of tools for merging artwork files may also be useful. For example, the information from the first stage output file is combined with the modified artwork file and the information from the first stage output file is combined with the unmodified artwork file. The merged files are provided in, for example, a second stage test format. The second stage test format, for example, is GSDII or OASIS. Providing the merged files in other types of formats may also be useful.

The merged second stage artwork file, the merged second stage modified artwork file, and the first stage output file are checked for consistency (second stage consistency check) at step 645. In one embodiment, the second stage check compares the merged files and the first stage output file for consistency. The second stage check compares a second set of features for consistency between the merged files and first stage output file. The second stage check may include, for example, comparing the first stage output file with the merged second stage artwork file, the first stage output file with the merged second stage modified artwork file, and the merged second stage artwork file with the merged second stage modified artwork file. Although the term "set" is used, it is contemplated to encompass a single feature as well. In one embodiment, the second set comprises metal information. For example, the metal information may include metal blockage or obstruction information. This check verifies whether all non-pin polygons for every metal layer are consistent. Checking for other or additional features may also be useful for the second set of features.

If the second stage consistency check on the second set of features fails at step 650, correction is made to the modified artwork file at step 655. The process proceeds to step 655 and repeats until the consistency check on the second set of features is successful. If the consistency check on the first set of features is successful, the process continues to step 660 where processing continues.

Continued processing may depend on the stage at which the consistency check is performed. For example, the consistency check may be performed on modified modules or a modified device which are provided in a library for access by the second group. In such cases, the modified file or files which passed consistency checking are provided in a library which can be accessed by the second group. In other cases, the modified device file has been provided by the second group to the third group to complete manufacturing. In such cases, the modified device file will be replaced with a corresponding unmodified device file to produce a final device artwork file. The final device artwork file is used to form MEBES files. The MEBES files are used to form photomasks employed in the manufacturing of the device. For example, the masks are used to pattern different layers of a wafer to form devices on the wafer. The wafer may be diced to separate the devices into individual devices which are assembled and tested.

In one embodiment, one of the consistency check stages validates a first parameter, such as pin text while the other consistency check stage validates a second parameter, such as LEF blockage information. Although as described, the first stage validates pin text while the second stage checks for LEF blockage, the sequence may be reversed. Validating other parameters in the modified files may also be useful. Furthermore, additional consistency check stages may be included to validate other parameters as desired.

In one embodiment, consistency check may be an automated tool which includes a consistency check software to perform consistency checking on input files. For example, the software may be stored in a storage medium. The software may be installed in a computer which processes the input files for consistency. In other embodiments, consistency checking may be performed manually. Performing consistency checking using a combination of manual and automated steps may also be useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing, by a computer, at least one original artwork file having front end of line (FEOL) and back end of line (BEOL) information, the original artwork file comprises an artwork file format;
performing, by a computer, a first stage check for a first set of features, the first stage check comprising
providing, by the computer, a modified artwork file corresponding to the original artwork file in a first modified artwork file format, wherein the modified artwork file contains BEOL information and excludes FEOL information;
performing, by a computer, a second stage check for a second set of features, the second stage check comprising
checking, by the computer, to ensure that the original and modified artwork files are consistent; and
wherein the first set of feature are different from the second set of features.

2. The method of claim 1 wherein:
a first stage check checks a first set of features; and
a second stage check checks a second set of features.

3. The method of claim 2 wherein:
the first stage check checks a first set of features related to pin information; and
the second stage check checks a second set of features related to metal information.

4. The method of claim 2 wherein:
the first stage check checks a first set of features related to pin information including pin name, pin layer, pin width, polygon alignment and missing or extra pin or a combination thereof; and
the second stage check checks a second set of features related to metal information including metal blockage.

5. The method of claim 2 wherein:
the first stage check comprises comparing first and second modified artwork files in first and second modified formats and the original artwork file for consistency, wherein the first stage files are converted into a first test format;
providing a first stage output file to the second stage check, the first stage output file comprises one of the first and second modified artwork files which is consistent, the first stage output file is provided in a second test format; and
the second stage check comprises
merging information of the first stage output file with one of the first and second modified artwork files to form a merged second stage modified artwork file in the second test format and merging information of the first stage output file with the original artwork file to form a merged second stage artwork file in the second test format, and
comparing the first stage output file, the merged second stage modified artwork file and the merged second stage artwork file for consistency.

6. The method of claim 5 wherein:
the first stage check checks a first set of features; and
the second stage check checks a second set of features.

7. The method of claim 6 wherein:
the first stage check checks a first set of features related to pin information; and
the second stage check checks a second set of features related to metal information.

8. The method of claim 6 wherein:
the first stage check checks a first set of features related to pin information including pin name, pin layer, pin width, polygon alignment and missing or extra pin or a combination thereof; and
the second stage check checks a second set of features related to metal information including metal blockage.

9. The method of claim 5 wherein the first modified format comprises Phantom GDSII and the second modified format comprises library exchange format (LEF).

10. The method of claim 5 wherein the one of the first and second test formats comprises GDSII or GDSII compatible format and other of the first and second test formats comprises design exchange format (DEF).

11. The method of claim 5 wherein the first test format comprises DEF and the second test format comprises GDSII or GDSII compatible format.

12. The method of claim 11 wherein:
the first stage check checks a first set of features related to pin information; and
the second stage check checks a second set of features related to metal information.

13. The method of claim 11 wherein:
the first stage check checks a first set of features related to pin information including pin name, pin layer, pin width, polygon alignment and missing or extra pin or a combination thereof; and
the second stage check checks a second set of features related to metal information including metal blockage.

14. The method of claim 1 comprises replacing the modified artwork file with the original artwork file to form a final artwork file of the device if the modified and original artwork files are consistent.

15. The method of claim 14 comprises:
forming MEBES files from the final device file to generate photomasks;
using photomasks to form the device.

16. A method for consistency checking comprising:
providing, by a computer, at least one original artwork file having front end of line (FEOL) and back end of line (BEOL) information, the original artwork file comprises an artwork file format;
performing, by a computer, a first stage check for a first set of features, the first stage check comprising
providing, by the computer, a modified artwork file corresponding to the original artwork file in a first modified artwork file format, wherein the modified artwork file contains BEOL information and excludes FEOL information;
performing, by a computer, a second stage check for a second set of features, the second stage check comprising
checking, by the computer, to ensure that the original and modified artwork files are consistent; and
wherein the first set of feature are different from the second set of features.

17. A non-transitory storage medium containing a program for performing:
a first stage check comprising
converting first and second modified artwork files in first and second modified formats and an original artwork file in an original format to a first test format, wherein the first test format includes BEOL information and excludes FEOL information, and
comparing the first and second modified art work files and original artwork file in the first test format for consistency;
providing a first stage output file to a second stage check, the first stage output file comprises one of the first and second modified artwork files which is consistent, the first stage output file is provided in a second test format; and
a second stage check comprising
merging information of the first stage output file with one of the first and second modified artwork files to form a merged second stage modified artwork file in the second test format and merging information of the first stage output file with the original artwork file to form a merged second stage artwork file in the second test format, and
comparing the first stage output file, the merged second stage modified artwork file and the merged second stage artwork file for consistency.

18. The non-transitory storage medium of claim 17 wherein the first stage check further comprising making correction to the modified artwork files if the consistency comparing fails.

19. The non-transitory storage medium of claim 17 wherein the second stage check further comprising making correction to the modified artwork files if the consistency comparing fails.

20. The non-transitory storage medium of claim 17 comprises replacing the merged second stage modified artwork file with the original artwork file to form a final artwork file of the device if the modified and original artwork files are consistent.

* * * * *